United States Patent [19]

Klein

[11] Patent Number: 5,392,036

[45] Date of Patent: Feb. 21, 1995

[54] EFFICIENT OPTIMAL DATA RECOPRESSION METHOD AND APPARATUS

[75] Inventor: Shmuel T. Klein, Rehovot, Israel

[73] Assignee: Mitan Software International (1989) Ltd., Ramat Gan, Israel

[21] Appl. No.: 142,016

[22] Filed: Oct. 28, 1993

[51] Int. Cl.$^6$ ............................................ H03M 7/30
[52] U.S. Cl. ....................................... 341/51; 341/55
[58] Field of Search ........................ 341/50, 51, 106, 55

[56] References Cited

U.S. PATENT DOCUMENTS

| | | | |
|---|---|---|---|
| 3,916,387 | 10/1975 | Woodrum et al. | 340/172.5 |
| 4,988,998 | 1/1991 | O'Brien | 341/55 |
| 5,049,881 | 9/1991 | Gibson et al. | 341/95 |
| 5,136,289 | 8/1992 | Yoshida et al. | 341/67 |
| 5,150,119 | 9/1992 | Yoshida et al. | 341/51 |
| 5,243,607 | 9/1993 | Masson et al. | 371/69.1 |

Primary Examiner—Marc S. Hoff
Attorney, Agent, or Firm—Mark M. Friedman

[57] ABSTRACT

A method for convening an input data character stream into an encoded data stream in a dictionary-based data compression system, which includes determining possible parsing options of the input data character stream; defining a directed labelled graph having vertices and edges, the graph being related to the possible parsing options; finding the elements of an optimal parsing by determining the shortest path between two given vertices of the graph, the finding of the elements of the optimal parsing including eliminating from the graph edges and vertices which cannot form a part of the shortest path; and encoding the elements of the optimal parsing.

22 Claims, 2 Drawing Sheets

POSITION
a b b a a b b a b a b
1 2 3 4 5 6 7 8 9 10 11 a b b a (4,4) (2,3)

a b b a a (4,2) a (2,2) b

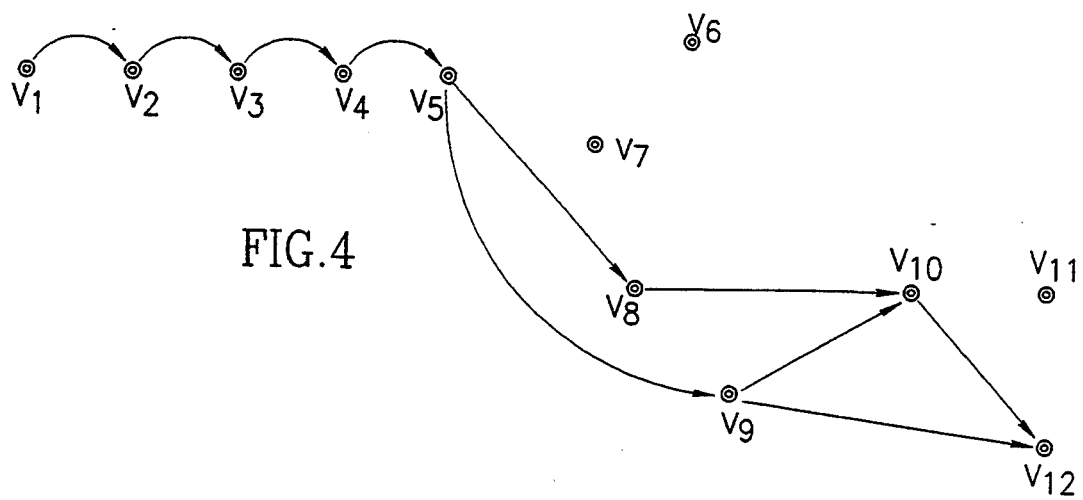
FIG.4
BIT POSITION  a a a a a a a   FIG.5A
              1 2 3 4 5 6 7
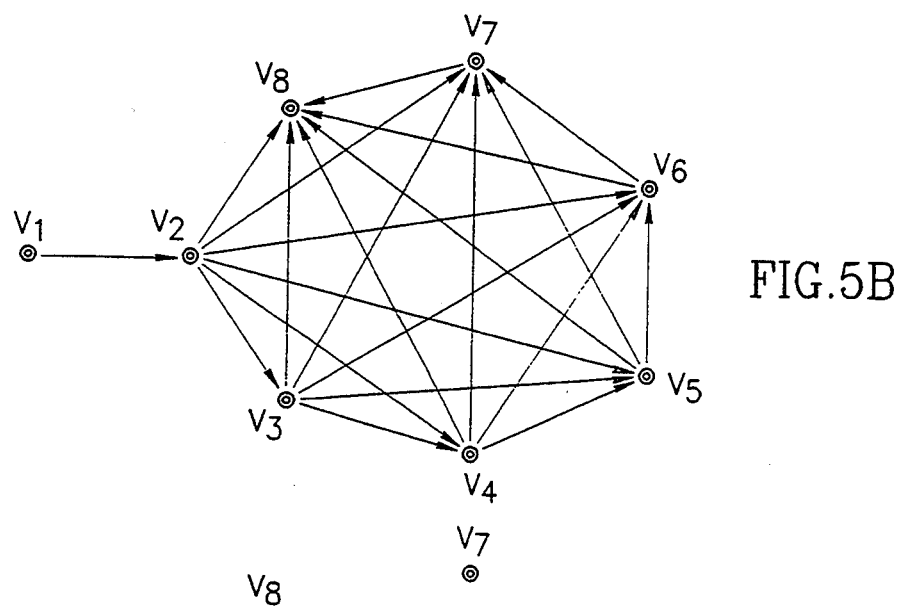
FIG.5B
FIG.5C
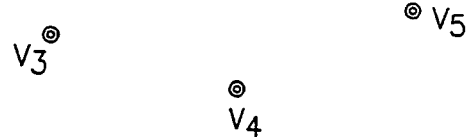

EFFICIENT OPTIMAL DATA RECOMPRESSION METHOD AND APPARATUS

FIELD AND BACKGROUND OF THE INVENTION

The present invention relates to data compression methods which are used to improve the way information is stored on a digital computer, or transmitted over communication channels.

The primary benefit of using a data compression system is to reduce storage space, which may lead to significant savings. For instance, compressing all the files on the hard disk of a PC may delay the need to purchase a new, larger, hard disk. Similarly, a large data base and the auxiliary files needed to turn it into a full text information retrieval system, may fit onto a single CD-Rom only after suitable compression has been applied.

In addition to reducing required storage space, data compression methods can also lead to savings in processing time. Although the use of compression implies a certain overhead for decompressing the data when the data is accessed, the rate determining steps, or bottlenecks, of most systems are still the relatively slow I/O operations. In many cases, the overhead incurred in the decompression process is largely compensated by the savings in the number of read operations from external storage devices.

The present invention involves lossless compression which are fully reversible methods, allowing the reconstruction of the original data without the loss of a single bit. Not all compression methods are lossless. For example, most image compression techniques are lossy, involving the discarding of a significant portion of the data and thereby yielding generally much higher compression ratios than are possible with lossless techniques.

Many compression methods have been proposed. One well known method was offered by Huffman, (see Huffman D. A., A Method for the Construction of Minimum Redundancy Codes, Proceedings of the I.R.E., Vol. 40 (1952), pp 1098-1110). The Huffman method is statistical and is based on the idea that frequently occurring characters are encoded by shorter codewords than rare characters. Huffman's algorithm discloses how to assign, under certain constraints, such codewords in an optimal way once the character distribution is given or has been determined.

Widely used are the various dictionary-based compression systems. These use a list, called a "dictionary", of variable length strings, such as frequent words or word fragments. Compression is achieved by replacing in the text to be processed the occurrences of strings which can be found in the dictionary by a pointer, which is shorter than the string, to the corresponding entry in the dictionary.

Many modern data compression techniques are based on the pioneering works of A. Lempel and J. Ziv. often referred to as LZ methods. Two such methods are disclosed in Ziv J., Lempel A., A Universal Algorithm for Sequential Data Compression, IEEE Trans. on Inf. Th. IT-23 (1977) 337-343 (hereinafter "LZ77"), and Ziv J., Lempel A., Compression of Individual Sequences via Variable Rate Coding, IEEE Trans. on Inf. Th. IT-24 (1978) 530-536 (hereinafter "LZ78"). The innovation of LZ77 and LZ78, which are both dictionary-based, is that they build the dictionary adaptively while scanning the text, by using fragments of the text itself.

In the LZ77 method the dictionary is, in fact, the previously scanned text, rather than a separately stored dictionary, thereby obviating the need to store an explicit dictionary for this case. A pointer is used which is of the form (d,l), where d is the offset (i.e., the number of characters from the current location to the previous occurrence of the substring starting at the current location), and l is the length of the matching substring.

LZ78 forms the basis of the LZW method described in Welch T. A., High Speed Data Compression and Decompression Apparatus and Method, U.S. Pat. No. 4,558,302, Dec. 10, 1985. In the LZW method each of the strings in the dictionary is obtained from one of the earlier elements by appending a new character to its right, such that the extended string matches the string currently processed.

A common difficulty of the various dictionary-based methods involves the efficient location of previous occurrences of substrings in the text. The method of backwardly scanning the entire text for each character to be processed is normally unacceptably slow.

Many schemes for more efficiently locating substrings have been suggested. These include the use of binary trees, as in Bell T. C., Better OPM/L Text Compression, IEEE Trans on Communications, COM-34 (December 1986) 1176-1182; the use of hashing, as in Brent R. P., A Linear Algorithm for Data Compression, The Australian Computer Journal 19 (1987) 64-68, and Gibson & Graybill, Apparatus and Method for Very High Data Rate-Compression Incorporating Lossless Data Compression and Expansion Utilizing a Hashing Technique, U.S. Pat. No. No. 5,049,881, Sep. 17, 1991; and the use of Patricia trees, as in Fiala & Greene, Textual Substitution Data Compression with Finite Length Search Windows, U.S. Pat. No. No. 4,906,991, Mar. 6, 1990.

The question of how to parse the original text into a sequence of substrings is a problem which is common to all dictionary-based compression methods. Generally, the parsing is done by a "greedy" method, i.e., a method which, at each stage, seeks the longest matching element from the dictionary. While greedy methods have the advantage of speed, they do not always yield optimal parsing.

Because the elements of the dictionary are often overlapping (which is particularly true of LZ77 variants where the text, which also serves as the dictionary, consists of numerous overlapping fragments), a different way of parsing may, under some circumstances yield better compression. For example, assume that the dictionary, D, consists of the strings {abc, ab, cdef, de, f} and that the text, T, is 'abcdef'; assume further that the elements of D are encoded by some fixed-length code, which means that, $\log_2(|D|)$ bits are needed to refer to any of the elements of D, where $|D|$ denotes the number of elements in D. Then, parsing T using a greedy method, which tries always to match the longest available string, yields abc-de-f, which requires three codewords, whereas a better partition would have been ab-cdef, which requires only two codewords.

There is thus a widely recognized need for, and it would be highly advantageous to have, a dictionary-based data compression technique capable of optimally parsing a text in a manner which is not prohibitively slow.

SUMMARY OF THE INVENTION

According to the present invention, there is provided a method for converting an input data character stream into an encoded data stream in a dictionary-based data compression system, comprising: (a) determining possible parsing options of the input data character stream; (b) defining a directed labelled graph having vertices and edges, the graph being related to the possible parsing options; (c) finding the elements of an optimal parsing by determining the shortest path between two given vertices of the graph, the finding of the elements of the optimal parsing including eliminating from the graph edges which cannot form a part of the shortest path; and (d) encoding the elements of the optimal parsing.

Also according to the present invention, there is provided an apparatus for converting an input data character stream into an encoded data stream in a dictionary-based data compression system, comprising: (a) first storage means for storing the input data character stream; (b) means for determining possible parsing options of the input data character stream; (c) means defining a directed labelled graph having vertices and edges, the graph being related to the possible parsing options; (d) means for finding the elements of an optimal parsing by determining the shortest path between two given vertices of the graph, the means for finding of the elements of the optimal parsing including means for eliminating from the graph edges which cannot form a part of the shortest path; (e) means for encoding said elements of the optimal parsing; and (f) second storage means for storing the elements of said optimal parsing.

According to further features in preferred embodiments of the invention described below, the method further comprises eliminating from the graph those vertices which cannot form a part of the optimal solution prior to determining the shortest path between two given vertices in the graph.

According to still further features in the described preferred embodiments, the elimination from the graph of those edges which cannot form a part of the optimal solution is achieved by adjoining to the graph an edge ($v_i$, $v_j$) emanating from vertex $v_i$ and directed at vertex $v_j$ only if vertex $v_j$ cannot be reached directly by an edge emanating from at least one of the predecessors of vertex $v_i$.

According to yet further features in the described preferred embodiments, the determination of the shortest path between two given vertices of the graph is effected using Dijkstra's algorithm.

BRIEF DESCRIPTION OF THE DRAWINGS

The invention is herein described, by way of example only, with reference to the accompanying drawings, wherein:

FIG. 4 is the graph corresponding to the text of FIG. 1, after having applied the pruning;

FIG. 5a is another short example of a text consisting of a single run;

FIG. 5a is the full graph corresponding to the text of FIG. 5a;

FIG. 5c is the pruned graph corresponding to the text of FIG. 5a.

DESCRIPTION OF THE PREFERRED EMBODIMENTS

Figures 1, 2A, 2B, 3:
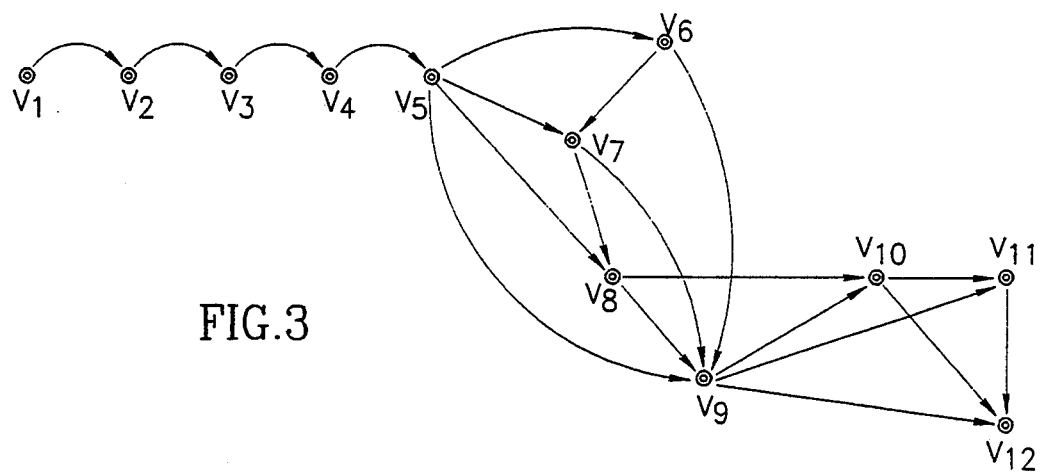
FIG. 1 is a short example text over the binary alphabet {a,b}.
FIG. 2a is a possible encoding, based on trying to match the longest previously occurring substring.
FIG. 2b is another possible encoding.
FIG. 3 is the directed labelled graph corresponding to the text of FIG. 1, without having applied any pruning.

The present invention is of a data compression method and apparatus which can be used to improve the efficiency of a wide variety of dictionary-based data compression techniques.

The present invention provides a way of optimally parsing a text. Without in any way limiting the scope of the present invention, it is envisioned that the main application of methods and apparatus according to the present invention is in off-line data compression, when the user is ready to invest more time to achieve enhanced compression. More specifically, the invention is most suitable as a "recompression" technique, preferably an off-line technique, for use in conjunction with a suitable on-line compression technique, although it may alternatively be used as a standalone compression technique, either on-line or off-line. For purposes of illustration only, the present invention is described herein as a "recompression" technique, it being understood that the term "recompression" is intended to incorporate not only on-line and off-line recompression but also on-line and off-line compression which does not follow, and is not dependent on, a previous compression.

Many currently available data compression systems offer on-the-fly, very fast, compression of files of any kind. These systems are used to better exploit available disk space by automatically compressing each file before writing the file to the disk. Such compression can have dramatic results. For example, compressing every file to a third of its original size, which is readily achievable for many files using existing technology, is equivalent to tripling the available disk space. However, such systems are attractive only as long as the additional time spent on compression is hardly noticeable to the user, i.e., if the compression time is negligible compared to the time needed to write to the disk. Thus, the compression process must be relatively fast. Similarly, decompression must also be fast, so that a compressed file can be accessed and read without noticeable delay.

Recompression can be usefully employed in a situation where a number of files have already been compressed using some fast, on-the-fly, compression method. Following the initial compression, the user wishes to reorganize the data on his disk into a more compact form. Since the recompression is to be done off-line, the time constraints on this reorganization process are less severe. Hence, a slower compression method can be used to further reduce the size of the files. The only requirement is that the encoded form of the recompressed file must be completely compatible with the original encoding so that the same decompression method may be used regardless of whether the original was only compressed or was compressed and then recompressed. Thus, the decompression process will use only a single procedure which will be equally applicable regardless of the compression history of the file to be decompressed.

The various dictionary-based compression methods use different methods of encoding the elements. The encoding is most simply done using codes of fixed length. More involved techniques, such as that described by Fiala & Greene (cited above) use a static variable-length code to encode the d and l values.

For example, values of d from 1 to 32 may be encoded by 6 bits, such as 0xxxxx, where xxxxx stands for the 5-bit binary representation of d-1, while values of d above 32 might be encoded, say, by 11 bits in the form 1xxxxxxxxxx, where xxxxxxxxxx is the 10-bit binary representation of d-33. In this particular encoding, the largest value of d which can be encoded is 1056. The idea behind such variable length codes is that small values of d or l are more frequent than larger values. Of course, the values of d can be partitioned into more than 2 classes, and the threshold points may vary. Also, two separate encoding methods may be used—one for l and a different method for d.

Extending this idea even further, as in Brent (cited above), one may use a dynamic variable length code which optimally adapts itself to the frequencies of the occurrences of the different values of d and l. Brent suggests parsing the text, producing the (d,l) pairs, and then using Huffman coding in the encoding phase.

The present invention achieves optimal recompression in the sense that once the method for encoding the elements is given, the technique according to the present invention finds the optimal way of parsing the text into such elements. Obviously, different encoding methods may yield different optimal parsings.

Returning to the example of the dictionary D and the text T discussed above, if the five elements of D—abc, de, f, ab, cdef—are encoded by 1, 2, 3, 4 and 4 bits, respectively, then the parsing abc-de-f requires only 6 bits for its encoding, whereas eight bits are required for the encoding of the parsing ab-cdef.

The method and apparatus of the present invention applies to any dictionary-based compression method with static (fixed or variable length) encoding. The elements to be encoded can be of any kind including, but not limited to, strings, characters, (d,l) pairs, and the like, and any combination of these. The proposed technique is thus able to improve a very broad range of different data compression methods, many of which have been published in the scientific literature or as patents, as well as techniques which have not to date been developed or published.

The method and apparatus of the present invention does not apply to methods which use dynamic encoding schemes, such as Brent's method mentioned above. Finding an optimal parsing for dynamic encoding methods is much more difficult, since the number of bits needed to encode an element of one of the possible partitions is not known in advance, and depends on the partition itself.

According to the present invention, an optimal parsing is found by transforming the problem of parsing the text into an equivalent graph theoretic problem. A directed, labelled graph is constructed, and the problem is reduced to finding the shortest path between two given vertices in this graph. One well-known algorithm for finding such shortest paths is Dijkstra's algorithm, which can be found in most textbooks on algorithms, for example in Aho A. V., Hopcroft J. E., Ullman J. D., Data Structures and Algorithms, Addison-Wesley Publishing Company, Reading, Mass. (1983). Many other such techniques are available or may become available. It is not intended that the present invention be limited to use with Dijkstra's algorithm which is used herein for illustrative purposes only.

The equivalence between the text parsing problem and graph theoretic shortest path problem has been noted in Katajainen J. and Raita T., An Approximation Algorithm for Space-Optimal Encoding of a Text, The Computer Journal, Vol 32 (1989) 228-237. However, the optimal method is not recommended in Katajainen and Raita because it might be too time consuming, as is next described in more detail.

Dijkstra's algorithm finds the shortest path in a time which can, in the worst case, be of the order of $n^2$, where n is the number of vertices in the graph. Another implementation has a time complexity of the order of $e \cdot \log(n)$, where e is the number of edges in the graph, which might be quicker or slower than the previous time scale, depending on whether the graph is 'sparse' or not.

For the present application, n equals the number of characters in the file (or file segment) to be compressed, and might thus be of the order of 10000 or more. For certain texts, particularly where repeated strings are frequent, the number of edges in the graph will be large, of the order of $n^2$. An algorithm with a time complexity of the order of $n^2$ or $e \cdot \log(n)$ can therefore be prohibitively slow. As a result, Katajainen and Raita suggest a sub-optimal, but quicker, alternative.

A key feature of a method and apparatus according to the present invention is the ability to find the optimal partition in an efficient manner by transforming the graph during the application of a shortest path algorithm, such as Dijkstra's algorithm, by reducing both the number of edges and generally also the number of vertices. The resulting method is sufficiently fast to allow optimal recompression, even in the case where the text is such that the corresponding graph would yield the worst case behavior using, for example, Dijkstra's algorithm.

The present invention represents an improvement to many dictionary-based compression methods. It shows how to parse, in a time efficient way, a given text into a sequence of elements of the dictionary such that the total length of the encoded text is minimized.

The optimal parsing is obtained by defining a closely related graph theoretical problem. For a given text consisting of a sequence of n characters $S_1 \ldots S_n$, define a directed, labelled graph, G. G=(V,E), where V is the set of vertices which corresponds to the possible character positions in the text. $V = \{v_1, v_2, \ldots, v_n, v_{n+1}\}$, with $v_i$ corresponding to the $i^{th}$ character position in the text for $i \leq n$, and $v_{n+1}$ corresponding to the end of the text. E is the set of directed edges. Elements of E are thus ordered pairs of the form $(v_i, v_j)$. A pair $(v_i, v_j)$, with $i < j$, belongs to E if and only if the corresponding substring of the text, that is, the sequence of characters $S_i \ldots S_{j-1}$, can be encoded as a single unit, i.e., the sequence $S_i \ldots S_{j-1}$ is a member of the dictionary.

Each edge of the graph is labelled, and the label $L(v_i, v_j)$ of each edge is defined, for a given encoding method, as the number of bits necessary to encode the corresponding member of the dictionary. The problem of finding the optimal parsing of the text given a specific dictionary and a specific encoding scheme thus reduces to the well-known problem of finding the shortest path from $v_1$ to $v_{n+1}$ in the graph G. In this case the 'shortest path' is the set of edges the sum of whose labels (corresponding to the encoding bits) is minimized.

Dijkstra's algorithm, or various other similar algorithms, may be used to find the shortest path. However, the time required to find the shortest path in the worst cases of such algorithms may vary as the square of the number of vertices. This is particularly disturbing when the text includes long runs of repeated characters, such as strings of zeros or blanks, in which case the number of possible ways of parsing the repeated characters may be so large that the time necessary to find the shortest path may be unacceptably long.

The present invention circumvents this worst case behavior by combining Dijkstra's shortest path algorithm, or similar algorithms, with a pruning method which serves to eliminate a priori those parts of the graph which cannot possibly be part of an optimal path. It is particularly easy to apply the pruning process in all cases for which the labelling function L satisfies the so-called triangle inequality, i.e.:

$$L(v_i, v_j) \leq L(v_i, v_k) + L(v_k, v_j)$$

for all k such that $i < k < j$. Many encoding schemes indeed satisfy the triangle inequality. For ease of description, it is assumed in what follows that the triangle inequality holds. Those skilled in the art may readily adapt the algorithm of the present invention to also work with specific encoding schemes which may not always satisfy the triangle inequality.

The set of edges, E, is constructed dynamically by the algorithm itself. One starts with E=empty set, and adjoins, in order, the edges emanating from $v_1$, $v_2$, etc., unless they fail to pass the following test. When a vertex $v_i$ is reached one considers the set of the predecessors of the vertex, Pred(i), where, Pred(i)=$\{v_j | (v_j, v_i) \epsilon E\}$, that is, Pred(i) is the set of vertices having a direct edge to $v_i$.

One now scans the substrings of the text starting at $S_i$. Suppose that the substring $S_i \ldots S_{j-1}$ is a member of the dictionary, so that the pair ($v_i$, $v_j$) is a candidate for being adjoined to the set of edges E. Before adding this edge to the set of edges E, one checks whether it is possible to reach $v_j$ directly from every vertex in Pred(i) without passing through $v_i$. If this is possible then there is no need to add the edge ($v_i$, $v_j$) to E, since, because of the triangle inequality, it is always preferable to take the direct edge from the element of Pred(i) to $v_j$ rather than to pass through $v_i$ and then going by the edge ($v_i$, $v_j$). However, if there is at least one element z in Pred(i) which has no direct edge to $v_j$ then the edge ($v_i$, $v_j$) must be added to E.

If, after having checked all the edges emanating from $v_i$, none of the edges has been adjoined to E, then there is no need to retain the vertex $v_i$ in the graph since it obviously cannot be a part of an optimal path from $v_1$ to $v_{n+1}$. In this case, all the incoming edges to $v_i$, i.e., the edges from elements of Pred(i) to $v_i$, may be eliminated, or "pruned", from the graph, and $v_i$ itself may also be eliminated.

The resulting pruned graph will often be considerably smaller than the un-pruned graph would have been, and will ordinarily be sufficiently sparse to allow the combined Dijkstra (or other) algorithm, in conjunction with a pruning algorithm according to the present invention, to efficiently process even those graphs for which Dijkstra's algorithm would exhibit worst case behavior.

While a method and apparatus according to the present invention may be applied to a wide variety of present and future data compression methods, for ease of exposition, it is assumed in what follows that use is made of a certain encoding model which is based on the LZ77 algorithm. The choice is made merely to facilitate the exposition of the principles of a method according to the present invention and should not be understood as in any way restricting the scope of the present invention. Those skilled in the art can readily adapt the algorithm according to the present invention to improve many other dictionary-based compression techniques with many other different encoding schemes. It should be noted, parenthetically, that the basic algorithm chosen for exposition is based on the LZ77 algorithm with the text itself serving as the dictionary. Thus, stating that 'the string can be encoded as a single unit' is equivalent, in this case, to stating that 'the string has occurred earlier in the text'.

In the specific implementation of the LZ77 algorithm chosen for the exposition of the preferred embodiment, the text is parsed into a sequence of elements of two kinds: (1) single characters, which are encoded by 9 bits, made up of a one-bit flag followed by the 8-bit ASCII representation of the character; and (2) (d,l) pairs, where d is a distance, i.e., the number of characters scanned backwards in the input string to find the previous occurrence of the string which matches the string starting at the current position, and l is the length of the recurring string. Only strings of length at least 2 are encoded by (d,l) pairs.

Referring to the example depicted in FIG. 1, it can be seen that the first 4 characters are encoded individually. However, position 5 marks the start of the string 'abb . . .' which has occurred earlier, namely, starting at position 1. FIG. 2a shows an encoding scheme wherein the repeating string is encoded as the pair (4,4), which means that the current string can be found by scanning 4 characters backwards to position 1, and then copying the next 4 characters forwards. At this point 8 of the 11 characters of the text (FIG. 1) have been processed. The current character to be processed is the 'b' in position 9. Since the string 'bab' in positions 9–11 can also be found in positions 7–9 (albeit with some overlapping, which is acceptable), the last 3 characters of the text are encoded by the pair (2,3). The parsing method described immediately above corresponds to seeking the longest possible match at each stage.

FIG. 2b demonstrates another possible parsing scheme. At position 5, even though the string which starts there occurred earlier, one could nevertheless encode the single character 'a' on its own. The following string 'bb' can be encoded as (4,2), even though not only 'bb', but also 'bba' could have been copied, using the pair (4,3). Although the number of elements, i.e., the sum of the number of single characters and the number of (d,l) pairs, in the parsing demonstrated in FIG. 2b is larger than that in FIG. 2a, this does not necessarily mean that the parsing technique of FIG. 2a is the more efficient of the two. The relative efficiency depends on the way the elements are encoded.

In a preferred embodiment according to the present invention, the d components of the (d,l) pairs are variously encoded by 8, 11 or 14 bits, depending on the value of d in question. More specifically, the first bit of each encoding string is a flag indicating that a distance, rather than a character, follows. The remaining 7, 10 or 13 bits, respectively, encode the values of d as follows:

| | | |
|---|---|---|
| 0xxxxxx | for $1 \leq d \leq 64$, | xxxxxx being the 6-bit binary representation of d-1 |
| 10xxxxxxxx | for $65 \leq d \leq 320$, | xxxxxxxx being the 8-bit |

| | | binary representation of d-65 |
|---|---|---|
| 11xxxxxxxxxxx | for 321 ≦ d ≦ 2368, | xxxxxxxxxxx being the 11-bit binary representation of d-321. |

The distance, d, in this example is assumed to be no greater than 2368.

The 1 component of each (d,l) pair is encoded by Elias' well-known Gamma-code. In fact, since e is always at least 2, one can encode the value m=1-2. The values of m are partitioned into classes $C(i)$, $i=0,1,\ldots$ $C(0)=\{0\}$, and for $i>0$, $C(i)=\{j \mid 2^{i-1}<=j<2^i\}$. For example, $C(1)=\{1\}$, $C(2)=\{2,3\}$, $C(3)=\{4,5,6,7\}$, etc. The only element in $C(0)$ is encoded by the single bit '0'. For $i>0$, an element j belonging to $C(i)$ is encoded by the following binary string—first come i consecutive 1's, then a '0', finally the (i−1)-bit binary representation of the integer $j-2^{i-1}$. For example, the number m=77 is encoded as follows: first, note that 77 is in $C(7)$. Thus, the encoding starts with seven 1's, followed by 0, followed by the 6-bit binary representation of $77-2^6=13$, which is 001101; hence the encoding of 77 is the 14-bit string '11111110001101'.

The first few elements of the list are therefore:

| m | encoding |
|---|---|
| 0 | 0 |
| 1 | 10 |
| 2 | 1100 |
| 3 | 1101 |
| 4 | 111000 |
| 5 | 111001 |
| 6 | 111010 |
| 7 | 111011 |
| 8 | 11110000 |
| 9 | 11110001 |

It is easy to see that the number of bits in the encoding of m is exactly $2(1+\lfloor \log_2 m \rfloor)$ for $m>0$.

Summarizing, the labels on the graph in the preferred embodiment are:

$$L(v_i, v_j) = \left\{ \begin{array}{l} 9 \text{ if } j = i+1 \\ \left\{ \begin{array}{l} 8 \text{ if } d < 65 \\ 11 \text{ if } 64 < d < 321 \\ 14 \text{ if } 320 < d < 2369 \end{array} \right\} + \\ \left\{ \begin{array}{ll} 1 & \text{if } j = i+2 \\ 2(1 + \lfloor \log_2(j-i-1) \rfloor) & \text{if } j > i+2 \end{array} \right\} \end{array} \right.$$

where $\lfloor x \rfloor$ denotes the integer pan of the real number x, $\log_2()$ is the logarithmic function with base 2, and the part of the definition for $j>i+1$ does only apply if the string $S_i \ldots S_{j-1}$ occurred already earlier in the text, i.e., there is a d such that the string $S_i \ldots S_{j-1}$ is identical to the string $S_{i-d} \ldots S_{j-d-1}$, with the additional constraint that $d<2369$. It is easy to verify that this labelling function indeed obeys the triangle inequality.

In a preferred embodiment according to the present invention, the text is partitioned into blocks of equal size, say 8192 bytes each, and each of the blocks is compressed individually. In the worst case, if a block consists of a single run of length 8192 of the same character, the set of the edges would consist of:

$$E=\{(v_1,v_2)\} \cup \{(v_i,v_j) | 2 \leq i \leq j \leq 8193\}.$$

The number of edges would then be 33,550,337. To avoid such large graphs, the pruning algorithm, described above is used. A formal definition of a pruning algorithm according to the present invention is as follows (with the lines numbered to facilitate the description below):

```
1.  Algorithm Prune
    {
2.    E ← empty set
3.    V ← {v₁, v₂, ..., v₈₁₉₂, v₈₁₉₃}
4.    for i ← 1 to 8192
      {
5.      Pred(i) ← { k | (vₖ, vᵢ) belongs to E }
6.      Succ(i) ← { j | Sᵢ ... Sⱼ₋₁ appeared earlier }
7.      added_edge ← FALSE
8.      for all j in Succ(i)
        {
9.        all_connected ← TRUE
10.       for all k in Pred(i)
          {
11.         if (vₖ, vⱼ) is not in E
12.         then all_connected ← FALSE
          }
13.       if not all_connected then
          {
14.         E ← E U {(vᵢ, vⱼ)}
15.         added_edge ← TRUE
          }
        }
16.     if not added_edge then
        {
17.       V ← V \ {vᵢ}
18.       E ← E \ Pred(i)
        }
      }
    }
```

To initialize the algorithm, the set E is defined at line 2 as an empty set, and the set of vertices V is defined to include $v_1$ to $v_{8193}$. At line 4 starts the main loop which is executed for each character position, except the End-Of-Text vertex. The variable i represents the index of the currently processed character. At line 5, the set Pred(i) of all the direct predecessors of vertex $v_i$ in the graph is defined, and at line 6, the set Succ(i) of potential successors. Succ(i) is not necessarily the set of direct successors, since not all the potential successors are necessarily adjoined.

At line 7, a Boolean variable 'added_edge' is initialized to FALSE. Only if one of the elements of Succ(i) is adjoined to E will added_edge be set to TRUE (line 15). If none of the elements of Succ(i) is adjoined (line 16) $v_i$ itself is deleted from V (line 17) as are all the incoming edges to $v_i$ (line 18). For each vertex, an internal loop starting at line 8 processes all the potential successors. The variable j is used to index these successors. At line 9, a Boolean variable 'all_connected' is initialized to TRUE. It checks that all the predecessors processed so far are directly connected to the potential successor $v_j$ (lines 10–12). If a predecessor has been found which is not connected to j, then all_connected is FALSE and therefore the edge $(v_i, v_j)$ cannot be pruned from the graph and is therefore adjoined (line 14).

Referring to the text of FIG. 1, the first 4 vertices, $v_1$ to $v_4$, have only a single successor each, namely, the vertex immediately succeeding it. By contrast, vertex $v_5$ could be connected to $v_6$ since the string 'a' can be encoded as a single character, or to $v_7$, $v_8$, and $v_9$, since the strings 'ab', 'abb' and 'abba', respectively, occur earlier in the text. However, the set Pred(5) includes only a single element, namely {4}, and there is no edge from $v_4$ to any of the vertices $v_6$ to $v_9$.

Therefore, at this stage of the algorithm, there are 4 outgoing edges from vertex $v_5$. At this point the algorithm returns to line 4 to process vertex $v_6$. Pred(6)={5} and Succ(6)={7,8,9}, since the strings 'b', 'bb' and 'bba' can be encoded as single units ('b' as a single character and 'bb' and 'bba' as (d,l) pairs, since 'bb' and 'bba' occurred earlier in the text). But checking now at line 11, one finds that ($v_5$, $v_7$) belongs to E. Therefore, all_connected is not set to FALSE on line 12 and, as a result, the edge ($v_6$, $v_7$) is not adjoined to the graph on line 13. Similarly, the edges ($v_5$, $v_8$) and ($v_5$, $v_9$) already exist, so ($v_6$, $v_8$) and ($v_6$, $v_9$) will not be added.

Reaching line 16, one finds that no edge emanating from $v_6$ has been adjoined. Hence, $v_6$ is deleted at line 17, and the previously added edge ($v_5$, $v_6$) is also eliminated.

Turning now to i=7, Pred(i)={5} (because vertex $v_6$, which is also a predecessor in the full graph, has been deleted), and Succ(7)={8,9}. As for $v_6$, no edge emanating from $v_7$ will be added because all its potential successors can be reached directly from its only predecessor. Therefore $v_7$ and ($v_5$, $v_7$) are pruned from the graph.

For i=8, Pred(8)={5} and Succ(8)={9,10}. Now ($v_5$, $v_9$) is already in the graph, so ($v_8$, $v_9$) will not be added, but there is no edge from $v_5$ to $v_{10}$, thus ($v_8$, $v_{10}$) must be adjoined.

For i=9, Pred(9)={5}, but $v_5$ is not connected to any successor of $v_9$, so the edges from $v_9$ to $v_{10}$, to $v_{11}$ and to $v_{12}$ are added.

The case i=10 is an example of having the set of predecessors which is larger than a singleton: Pred(10)={8,9}. Edges from and $v_{12}$ must be added because there are no edges reaching them directly from $V_8$.

Finally, Pred(11)={9,10}, Succ(11)={12}, and no edge needs to be added. Therefore, from line 16, $v_{11}$ and ($v_9$, $v_{11}$) and ($v_{10}$, $v_{11}$) are deleted.

Note that since all the successors of $v_{10}$ are also successors of $v_9$, the triangle inequality in fact implies that the edge ($v_9$, $v_{10}$) could also have been eliminated. The reason this is not done in the algorithm is because the loop starting at line 10, passing over the predecessors, is internal to the loop starting at line 8, passing over the successors. Therefore, when ($v_9$, $v_{10}$) is adjoined, the algorithm does not yet know of the successors of $v_{10}$. An additional loop checking also such cases may be added but is not deemed to be justified.

An important component in the algorithm is a method of keeping track of the predecessors and successors of each vertex. Tables may be used and should be able to be efficiently scanned. As can be seen in the above examples, both the set of predecessors and the set of successors consist of consecutive vertices. It can be shown that this is true in general, and not just in the given example, which implies that the search for predecessors and successors may be restricted in a manageable fashion. Accordingly, in a sequential scan for predecessors, as soon as a vertex is found which is not a predecessor the scanning process may be stopped, which considerably reduces the amount of manipulation required. Similarly, in a sequential scan for successors, as soon as a vertex is found which is not a successor the scanning process may be stopped.

Without in any way limiting the scope of the present invention, it is believed that a proof that both the set of predecessors and the set of successors consist of consecutive vertices is as follows:

Theorem 1: For each node x, Succ(x) consists of consecutive elements, i.e.:

$$|Succ(x)|=k \rightarrow \exists j \geq x Succ(x)=\{x+j+1, x+j+2, \ldots, x+j+k\}$$

Proof: By induction on x. For x=0, Succ(0)={1}. Suppose the claim is true for indices smaller than x, and let y be the largest index such that y $\in$ Succ(x) but y−1 $\notin$ Succ(x). If y=x+1, then Succ(x) are the numbers immediately following x. Suppose then that y$\geq$x+2. One has to show that x is not connected to any vertex t<y−1. The fact that y is in Succ(x) means that the string $S_x \ldots S_{y-1}$ appeared earlier, and thus also its prefix $S_x \ldots S_{y-2}$ appeared earlier. Therefore the reason that y−1 is not Succ(x) must be that the edge (x, y−1) has not been added to the graph because of the pruning process. That is, for all z $\in$ Pred(x), the edge (z, y−1) did exist. So since for each of these z, both x and y−1 belong to Succ(z), it follows from the inductive hypothesis that all elements t such that x<t<y−1 are also in Succ(z). But then, by the pruning process, the edge (x, t) will not be added.

Theorem 2: For each node x>0, Pred(x) consists of consecutive elements, i.e.:

$$|Pred(x)|=k \rightarrow \exists j \leq x Pred(x)=\{x-j-k, \ldots, x-j-2, x-j-1\}$$

Proof: By induction on x. For x=1, Pred(1)={0}. Suppose the claim is true for indices smaller than x, and let y be the smallest index such that y $\in$ Pred(x) but y+1 $\notin$ Pred(x). If y=x−1, then Pred(x) are the numbers immediately preceding x. Suppose then that y$\leq$x−2. One has to show that no vertex t$\geq$y+1 is connected to x. The fact that y $\in$ Pred(x) means that the string $S_y \ldots S_{x-1}$ appeared earlier, and thus also its suffix $S_{y+1} \ldots S_{x-1}$. Therefore the reason that y+1 is not in Pred(x) must be that the edge (y+1, x) has not been added to the graph because of the pruning process. That is, for all z $\in$ Pred(x), the edge (z, x) did exist, hence $$z \in Pred(x) \tag{1}$$

But this means that both y+1 and x are in Succ(z): therefore, either y+2=x, in which case the proof is completed, or if y+t<x, then by Theorem 1, y+t is also in Succ(z), which is a set of consecutive numbers. If follows that $$z \in Pred(y+t). \tag{2}$$

So since all the elements in Pred(y+1) have a direct edge to y+t, it follows from the pruning process that the edge (y+1, y+t) will not be added to the graph, i.e., $$y+1 \notin Pred(y+t) \tag{3}$$

It should now be shown that there is no edge from y+t to x. Obviously, the string $S_{y+t} \ldots S_{x-1}$ could be encoded, since it is a suffix of $S_y \ldots S_{x-1}$ which can be encoded, so one must show that $(y+t, x)$ will not be added because of the pruning. In other words, one needs to show that all elements in $\text{Pred}(y+t)$ have an edge to x. One knows this fact already for the elements of $\text{Pred}(y+1)$. So suppose there is an element $$z' \in \text{Pred}(y+t) - \text{Pred}(y+1) \qquad (4)$$

which is not connected to x. Then the string $S_{z'} \ldots S_{y+t-1}$ has appeared, so did also the string $S_{z'} \ldots S_y$; thus the fact that $z' \notin \text{Pred}(y+1)$ is due to the pruning process. That is, all $z'' \in \text{Pred}(z')$ are connected to $y+1$, thus $z'' \in \text{Pred}(y+1)$. But these $z''$ are smaller than $z'$, hence applying the inductive hypothesis to $\text{Pred}(y+1)$, it follows that every element z of $\text{Pred}(y+1)$ is smaller than $z'$, since $z' \notin \text{Pred}(y+1)$.

But z is also in $\text{Pred}(x)$ by (1) and $z'$ is not in $\text{Pred}(x)$. It follows that there must be an element $z''$, $z \leq z'' < z'$ such that $z'' \in \text{Pred}(x)$ and $z''+1 \notin \text{Pred}(x)$. But since y has been chosen as the smallest number having this property, one must have $z'' \geq y$ and therefore $z' \geq y+1$. But $z' \in \text{Pred}(y+t)$ by (4) and $y+1 \notin \text{Pred}(y+t)$ by (3), so that in fact $z' > y+1$.

Three numbers $z < y+1 < z'$ have thus been found such that the first and the third belong to $\text{Pred}(y+t)$ by (2) and (4), respectively, whereas the second does not by (3); this is a contradiction to the inductive hypothesis, by which $\text{Pred}(y+t)$ is a set of consecutive numbers.

One concludes that there cannot possibly be an element $z'$ as defined in (4), which is not connected to x. Therefore, all elements in $\text{Pred}(y+t)$ are connected to x, so by the pruning process, the edge $(y+t, x)$ will not be added to the graph.

While the invention has been described with respect to a limited number of embodiments, it will be appreciated that many variations, modifications and other applications of the invention may be made.

What is claimed is:

1. A method for converting an input data character stream into an encoded data stream in a dictionary-based data compression system, comprising:
   (a) determining possible parsing options of the input data character stream;
   (b) defining a directed labelled graph having vertices and edges, said graph being related to said possible parsing options;
   (c) finding the elements of an optimal parsing by determining the shortest path between two given vertices of said graph, said finding of said elements of said optimal parsing including eliminating from said graph edges which cannot form a part of said shortest path; and
   (d) encoding said elements of said optimal parsing.

2. A method as in claim 1, further comprising, prior to determining said shortest path between said two given vertices of said graph, eliminating from said graph vertices which cannot form a part of said shortest path.

3. A method as in claim 2, wherein said elimination from said graph of those edges which cannot form a part of said shortest path is achieved by adjoining to said graph an edge $(v_i, v_j)$ emanating from vertex $v_i$ and directed at vertex $v_j$ only if vertex $v_j$ cannot be reached directly by an edge emanating from at least one of the predecessors of vertex $v_i$.

4. A method as in claim 3, wherein said elimination from said graph of those vertices which cannot form a part of said shortest path is achieved by deleting from said graph a vertex $v_k$ if none of the edges emanating from vertex $v_k$ has been adjoined.

5. A method as in claim 4, wherein once said vertex $v_k$ has been deleted, all edges terminating at vertex $v_k$ are eliminated.

6. A method as in claim 5, wherein said determination of the shortest path between said two vertices of said graph is effected using Dijkstra's algorithm.

7. A method as in claim 4, wherein said determination of the shortest path between said two vertices of said graph is effected using Dijkstra's algorithm.

8. A method as in claim 3, wherein said determination of the shortest path between said two vertices of said graph is effected using Dijkstra's algorithm.

9. A method as in claim 1, wherein said vertices, $\{v_1, v_2, \ldots, v_n, v_{n+1}\}$, correspond to the possible character positions of the input data character stream, where $v_i$ corresponds to the $i^{th}$ character position in the input data character stream for $i \leq n$, and $v_{n+1}$ corresponds to the end of the input data character stream.

10. A method as in claim 9, wherein said edges are ordered pairs of the form $(v_i, v_j)$, where ordered pair $(v_i, v_j)$, with $i < j$, is an edge if and only if the corresponding substring of the input data character stream can be encoded as a single unit.

11. A method as in claim 10, wherein each of said edges of said graph is labelled with a label $L(v_i, v_j)$ which is related to the number of bits necessary to encode the corresponding member of the dictionary.

12. A method as in claim 9, wherein said two given vertices of said graph correspond, respectively, to $v_1$ and $v_{n+1}$.

13. A method as in claim 1, wherein said elimination from said graph of those edges which cannot form a part of said shortest path is achieved by adjoining to said graph an edge $(v_i, v_j)$ emanating from vertex $v_i$ and directed at vertex $v_j$ only if vertex $v_j$ cannot be reached directly by an edge emanating from at least one of the predecessors of vertex $v_i$.

14. A method as in claim 13, wherein said determination of the shortest path between said two vertices of said graph is effected using Dijkstra's algorithm.

15. A method as in claim 1, wherein said determination of the shortest path between said two given vertices of said graph is effected using Dijkstra's algorithm.

16. An apparatus for converting an input data character stream into an encoded data stream in a dictionary-based data compression system, comprising:
   (a) first storage means for storing the input data character stream;
   (b) means for determining possible parsing options of the input data character stream;
   (c) means defining a directed labelled graph having vertices and edges, said graph being related to said possible parsing options;
   (d) means for finding the elements of an optimal parsing by determining the shortest path between two given vertices of said graph, said means for finding of said elements of said optimal parsing including means for eliminating from said graph edges which cannot form a part of said shortest path;
   (e) means for encoding said elements of said optimal parsing; and
   (f) second storage means for storing said elements of said optimal parsing.

17. An apparatus as in claim 16, further comprising, means for eliminating from said graph vertices which cannot form a part said shortest path prior to determining said shortest path between said two vertices of said graph.

18. An apparatus as in claim 17, wherein said means for eliminating from said graph those edges which cannot form a part o f said shortest path operates by adjoining to said graph an edge ($v_i$, $v_j$) emanating from vertex $v_i$ and directed at vertex $v_j$ only if vertex $v_j$ cannot be reached directly by an edge emanating from at least one of the predecessors of vertex $v_i$.

19. An apparatus as in claim 18, wherein said means for eliminating from said graph of those vertices which cannot form a part of said shortest path operates by deleting from said graph a vertex $v_k$ if none of the edges emanating from vertex $v_k$ has been adjoined.

20. An apparatus as in claim 19, further including means for eliminating all edges terminating at vertex $v_k$ once said vertex $v_k$ has been deleted.

21. An apparatus as in claim 16, wherein said means for eliminating from said graph those edges which cannot form a part of said shortest path operates by adjoining to said graph an edge ($v_i$, $v_j$) emanating from vertex $v_i$ and directed at vertex $v_j$ only if vertex $v_j$ cannot be reached directly by an edge emanating from at least one of the predecessors of vertex $v_i$.

22. An apparatus as in claim 16, wherein said means for determining said shortest path between the beginning and end of said graph includes Dijkstra's algorithm.

* * * * *